United States Patent [19]
Behan et al.

[11] Patent Number: 5,977,826
[45] Date of Patent: Nov. 2, 1999

[54] CASCADED ERROR CORRECTION IN A FEED FORWARD AMPLIFIER

[76] Inventors: Scott T. Behan, 6438 W. Greentree Dr., Somis, Calif. 93066; Benone Achiriloaie, 817 Paseo Camarillo #452, Camarillo, Calif. 93010

[21] Appl. No.: 09/083,579

[22] Filed: May 21, 1998

Related U.S. Application Data

[60] Provisional application No. 60/077,839, Mar. 13, 1998.

[51] Int. Cl.$^6$ ...................................................... H03F 1/26
[52] U.S. Cl. ............................. 330/151; 330/149; 330/52
[58] Field of Search ............................... 330/151, 52, 149

[56] References Cited

U.S. PATENT DOCUMENTS

| | | | |
|---|---|---|---|
| 4,352,072 | 9/1982 | Harrington | 330/149 |
| 4,617,522 | 10/1986 | Tarbutton et al. | 330/149 |
| 4,926,134 | 5/1990 | Olver | 330/151 |
| 5,166,634 | 11/1992 | Narahashi et al. | 330/151 |
| 5,304,945 | 4/1994 | Myer | 330/151 |
| 5,528,196 | 6/1996 | Baskin et al. | 330/151 |
| 5,576,659 | 11/1996 | Kenington et al. | 330/151 |
| 5,796,304 | 8/1998 | Gentzler | 330/151 |
| 5,867,064 | 2/1999 | Van Horn et al. | 330/151 |

*Primary Examiner*—Benny Lee
*Assistant Examiner*—Khanh Van Nguyen
*Attorney, Agent, or Firm*—Gene W. Arant; Larry D. Baker

[57] ABSTRACT

A feedforward amplifier system including a main amplifier and first and second error amplifiers, and wherein the first error amplifier is itself a feedforward amplifier whose operation is corrected by the second error amplifier. With appropriate selection of circuit components the operating power required by the amplifier system, and hence the size of the package in which it is contained, may be reduced up to one-third.

2 Claims, 11 Drawing Sheets

I. INPUT MESSAGE SIGNAL MS
J. AMPLIFIED MS, WITH ERROR E1
K. ERROR E1
L. AMPLIFIED ERROR E1, WITH ERROR E2
M. ERROR E2
N. AMPLIFIED ERROR E2
R. AMPLIFIED ERROR E1 ( ERROR E2 CANCELLED )
O. AMPLIFIED MS ( ERROR E1 CANCELLED )

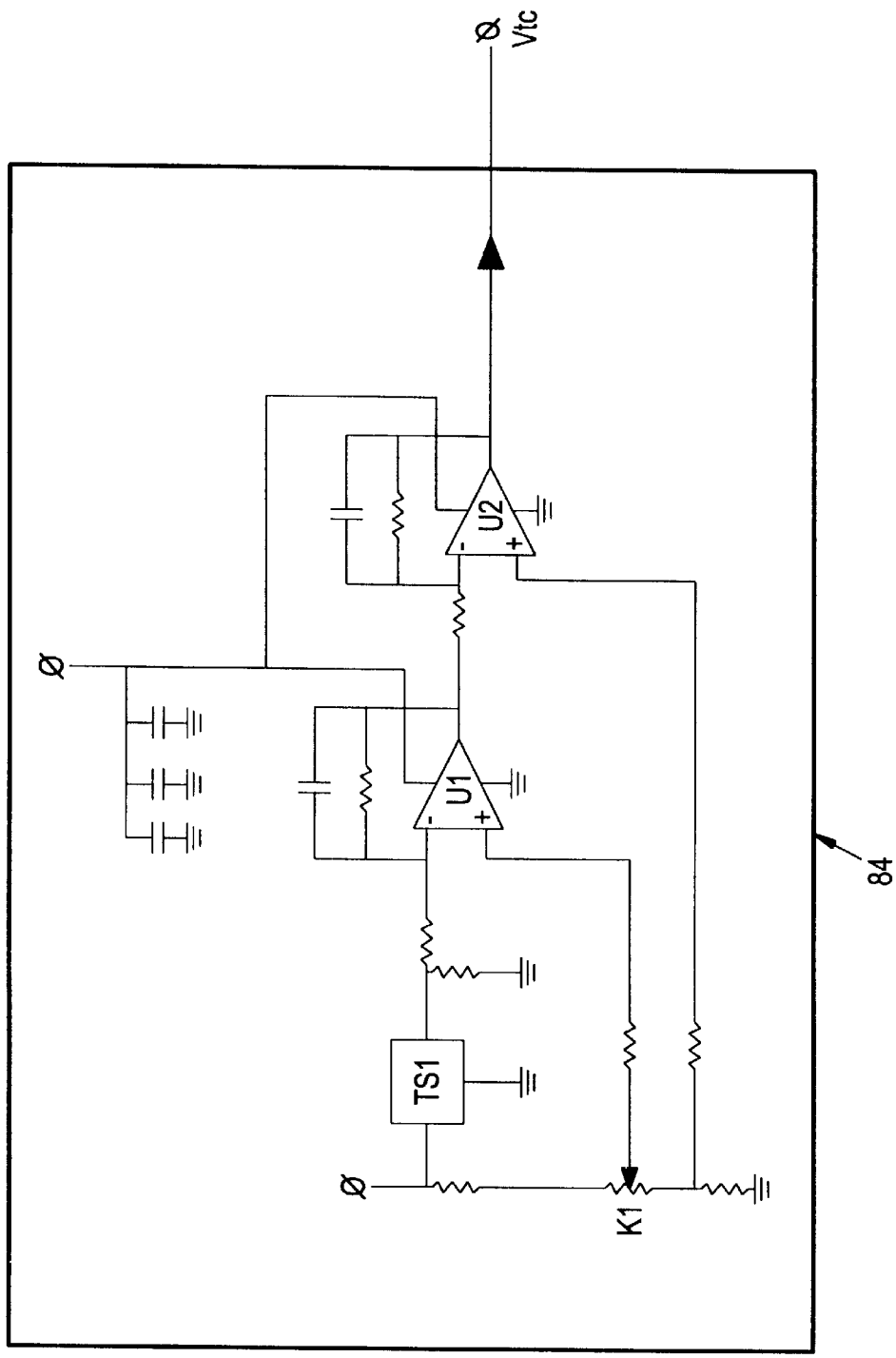

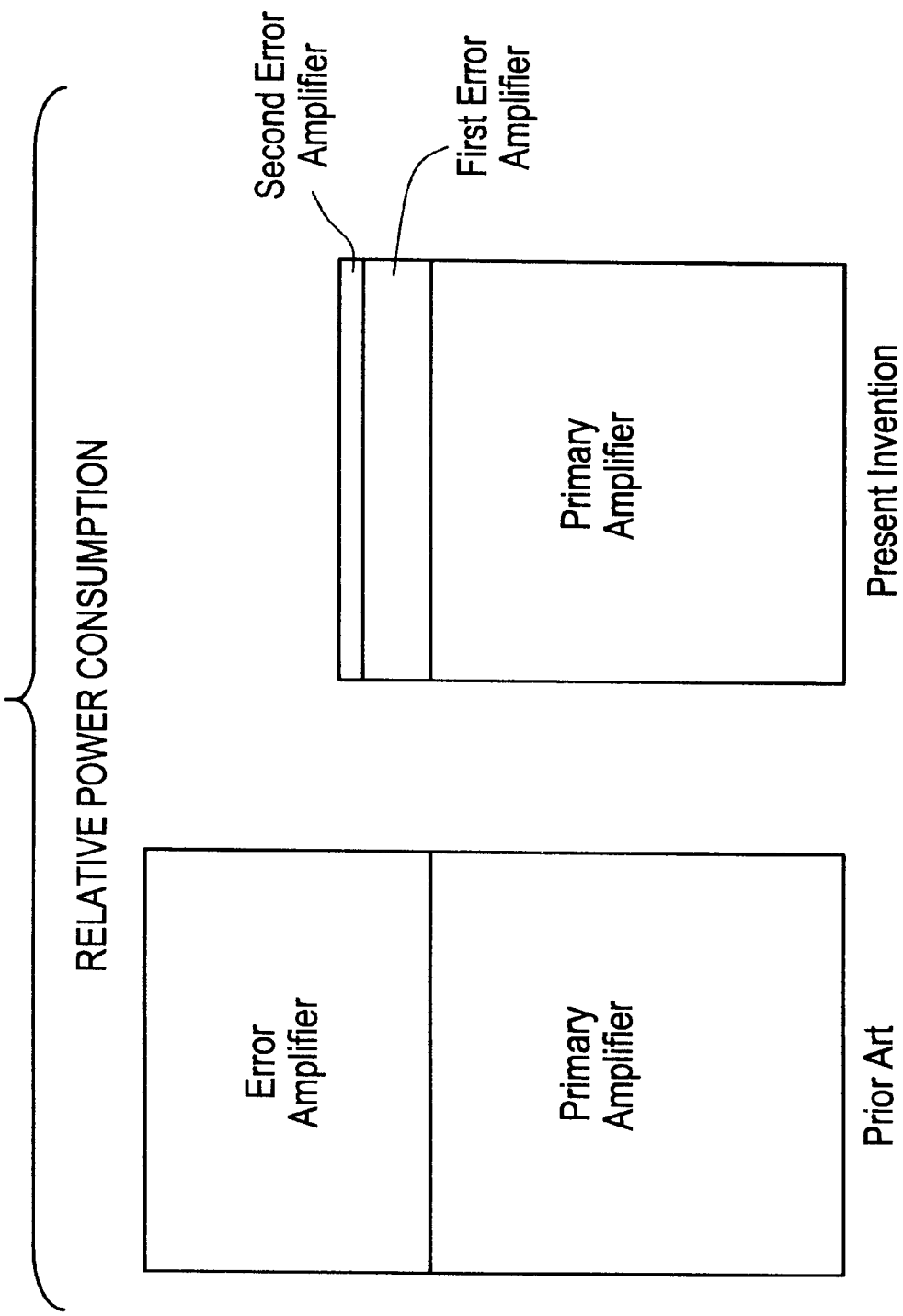

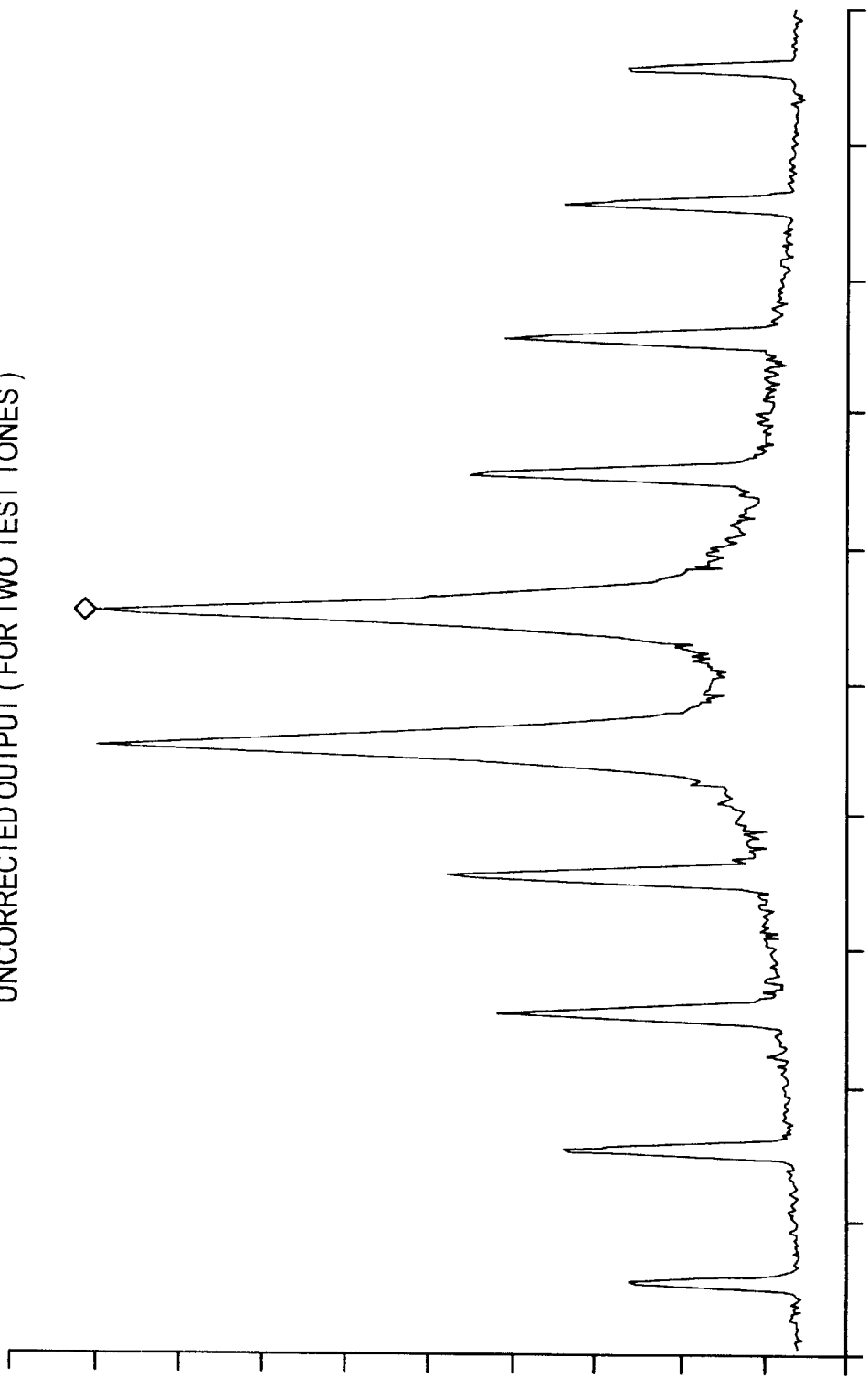

OUTPUT WITH SINGLE ERROR AMPLIFIER OPERATING

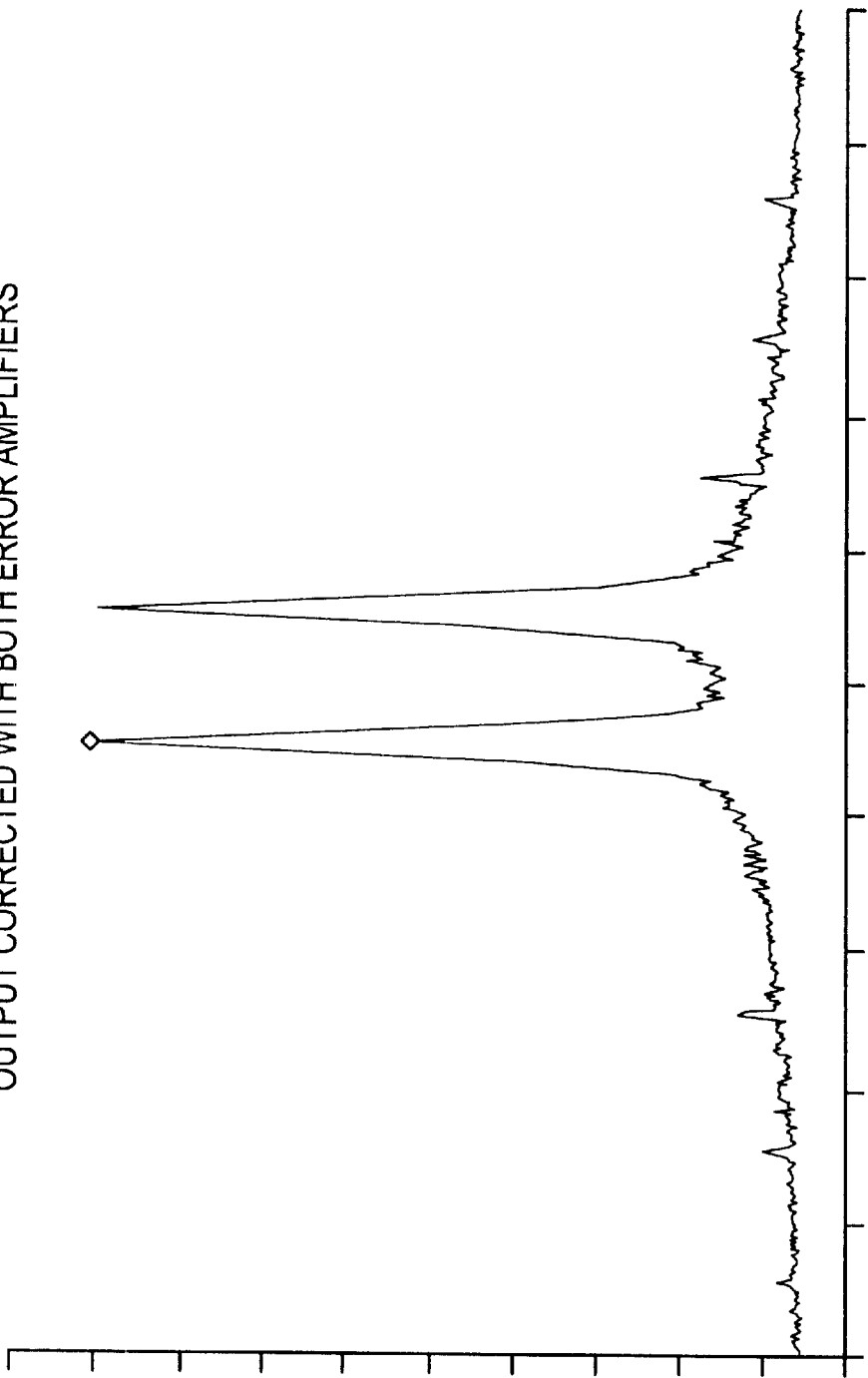

CASCADED ERROR CORRECTION IN A FEED FORWARD AMPLIFIER

RELATED APPLICATION

This application claims the benefit of our U.S. Provisional Application Ser. No. 60/077,839 which was filed on Mar. 13, 1998.

FIELD OF THE INVENTION

This invention relates to electronic communication, and more particularly to amplification of multi-channel high frequency signals.

BACKGROUND OF THE INVENTION

Error correction of amplifiers grows ever more important as frequency allocation, frequency reuse, and RF interference (RFI) become more prevalent. In the amplification of electronic message signals one paramount consideration is to maintain signal fidelity, while another paramount consideration is to minimize the operating power requirements. Those two factors are in conflict with each other. High efficiency amplifiers will typically have high signal distortion, but high-fidelity amplifiers typically require high operating power.

All amplifiers produce distortion products, or error signals, as a part of the amplification process. The amount of error varies, but is primarily due to the operational class of the amplifier. Class C amplifiers, while very efficient, generate significant error signals. Class AB amplifiers operate somewhat less efficiently, producing less error than a Class C amplifier operating at similar power levels. Class A amplifiers provide the lowest level of error signal, but at a higher cost such that the power efficiency of the amplifier is very poor. As a tradeoff, one can use a Class AB amplifier for a specific application such as wireless telephony transmission, and utilize associated circuitry operating in the feed forward cancellation mode for reducing the error components generated by the amplifier. This provides reduced error levels at a reasonable level of operational efficiency.

The feed forward error control concept was originated in the 1920's by Harold S. Black and described in his U.S. Pat. No. 1,686,792 issued Oct. 9, 1929. The concept is more fully described in an article entitled "A Microwave Feed-Forward Experiment", by H. Seidel, published in The Bell System Technical Journal, Vol. 50, No. 9, Nov., 1971. Its important properties are that it incorporates time, phase and amplitude compensation to reduce error signals produced by the amplifier. Compensation of these three parameters allows operation at much higher frequencies, and over much greater bandwidths, than other types of error control such as negative feedback. Also, because time compensation is incorporated into the system, the ultimate performance of the system becomes dependent upon the physical component variations, and not upon limitations due to transit time and associated phase shift through the system.

The feed forward amplifier system utilizes a main amplifier having a high power efficiency, and which is permitted to operate with high signal distortion. Associated circuits then observe and measure the distortion or error, and produce a correction signal which is added into the final output of the amplifier system so as to offset or counteract the signal distortion. A comparison is made between input and output signals of the main amplifier in order to provide an error signal, and a separate error amplifier is utilized to amplify the error signal before its re-insertion with appropriate polarity into the main amplifier path. Feed forward amplifier systems typically have poor power efficiency, however.

The feed forward amplification process involves signal amplification, recognition and amplification of the errors or undesired signals, and combination of properly compensated error signals with the distorted output signal of the main amplifier so as to produce a corrected final output signal in which the level of the error signals is reduced by cancellation or destructive interference. Associated circuitry includes an error correction circuit for detecting message signal error in the operation of the main amplifier and producing an amplified message signal error which is then subtracted from the amplified and distorted message signal output of the main amplifier to produce a corrected final output signal.

Signal amplification in the main amplifier not only produces signal distortion or error, but also delays the signal as it flows along the main signal path. A comparison loop that compares the input and the output of the main amplifier must have an artificial time delay inserted into it to balance the inherent time delay that could not be avoided in the main signal path.

As is well known, the performance of amplifiers and other comparable communication circuits will drift as a function of power supply voltage, temperature changes, time, and other environmental factors. The typical reason for such a drift in performance is that the actual or effective values of some of the circuit components change. It is therefore a well known expedient to provide such circuitry with adaptive controls that respond to changing circuit conditions so as to maintain circuit performance at as near a constant level as possible. Most commonly, these adaptive controls involve negative feedback circuitry, often with a test tone for detecting and drift in the circuit performance.

Thus a typical feed forward amplifier system for amplifying radio frequency telephony signals includes a main amplifier, an error correction circuit including an error amplifier for producing an amplified message signal error that is then subtracted from the amplified and distorted message signal output of the main amplifier for cancelling error prior to a final output circuit, and a negative feedback circuit coupled to the final output circuit for compensating and minimizing variation or drift in the operation of the error amplifier.

In modern communication circuits there is a need for efficient, high fidelity amplification of information signals occupying wide frequency bands. The information may require processing in analog form, in digital form, or in some combination or variation thereof. At the same time, it is important to maintain high fidelity throughout the operating frequency band.

In modern cellular telephone systems the base station or repeater amplifiers may be required to amplify signals occupying a bandwidth that is up to three percent of an underlying carrier frequency. Personal Communication System (PCS) equipment may require effective operation over bandwidths of more than three per cent of an underlying carrier frequency. Consistent, reliable, high fidelity amplification throughout such a frequency band is inherently difficult to achieve.

Many engineering techniques besides amplification and the balancing of time delays are required to implement an effective feed forward amplifier system. Signal amplification and signal sampling circuits may be adjusted to provide balanced signals where needed. Signal splitting may be utilized to provide a sample of a particular signal without destroying the original. Coupling circuits may be utilized to combine signals either additively or substractively, as may be required. Phase correction or stabilization may be provided at appropriate points in the circuitry. Use of these techniques in proper combination then makes it possible to produce an amplified error signal that, when added to the amplified message signal, will provide an output signal from the feed forward system that is essentially free of signal distortion.

To achieve that result, however, it has generally been necessary to employ an error amplifier that operates at a power level roughly as high as the power level of the main amplifier. Even though the error signal being amplified in the error amplifier is of smaller magnitude than the signal in the main signal path, high operating power is required in order for the error amplifier to maintain a Class A operation of satisfactory linearity. Thus, the total operating power consumed may be approximately double the power consumed by the main amplifier alone.

SUMMARY OF THE PRESENT INVENTION

In a feed forward amplifier system according to the present invention the traditional error amplifier is now deliberately selected to have sufficiently low operating power that it cannot faithfully reproduce the original error signal. Hence a new error, created by the error amplifier itself, is introduced into the system, but of lesser magnitude than the original error signal. A low-power second or auxiliary error amplifier is then utilized to linearly amplify the new error that was created by the primary error amplifier.

An error amplifier sub-system or module thus includes both a primary or first error amplifier, and an auxiliary or second error amplifier, operating in cascade. This arrangement may be viewed as constituting an error amplifier that is itself also a feed forward amplifier.

Within the error amplifier module, the first error amplifier is selected to have a much lower operating power level than a conventional error amplifier, the tradeoff being that it produces significant signal distortion. Thus the first error amplifier, while correcting substantially all of the first error signal, will produce an additional error of lesser magnitude, which may be observed by comparing the input and output of the first error amplifier.

It is the function of the second error amplifier to correct the new error that was introduced by the first error amplifier. The relatively small amplitude of the new error permits selecting a second error amplifier of relatively low power, but which has satisfactory linearity in amplifying the new or second error signal. The combined power requirements of the first and second error amplifiers represent a significant reduction in the total power required for error correction.

According to the invention, proper selection of circuit components makes it possible to maintain linearity of the output signal of the feed forward amplifier system with a substantial reduction in the operating power required for the system as a whole. An important result achieved by the invention is that reduction in the total operating power requirement also makes possible a corresponding reduction in the size of the entire feed forward amplifier system package, by as much as one-third.

The first or primary error amplifier may, for example, be a class A amplifier operated partially into its non-linear region or a class AB amplifier. The second or auxiliary error amplifier will typically be a linear Class A amplifier.

The invention may also be viewed as the addition of an intermediate error correction stage between the relatively high-distortion main amplifier and the low-distortion error amplifier. This intermediate error correction stage has the function of reducing the amplitude of the error signal which the error amplifier must linearly reproduce, thus permitting a dramatic reduction in the size and power consumption of the error amplifier. Since power consumption is proportional to the square of the signal amplitude, a moderate reduction in the amplitude of the error signal permits a large reduction in the operating power requirements (and hence, the physical size) of the error amplifier.

In its present application the amplifier system of the present invention will typically amplify a message signal that includes a group of radio frequency telephony signals that are to be processed concurrently, or a noise-like signal of significant bandwidth such as that produced by one or more code division multiple access (CDMA) signals.

DRAWING SUMMARY

Figure 1:
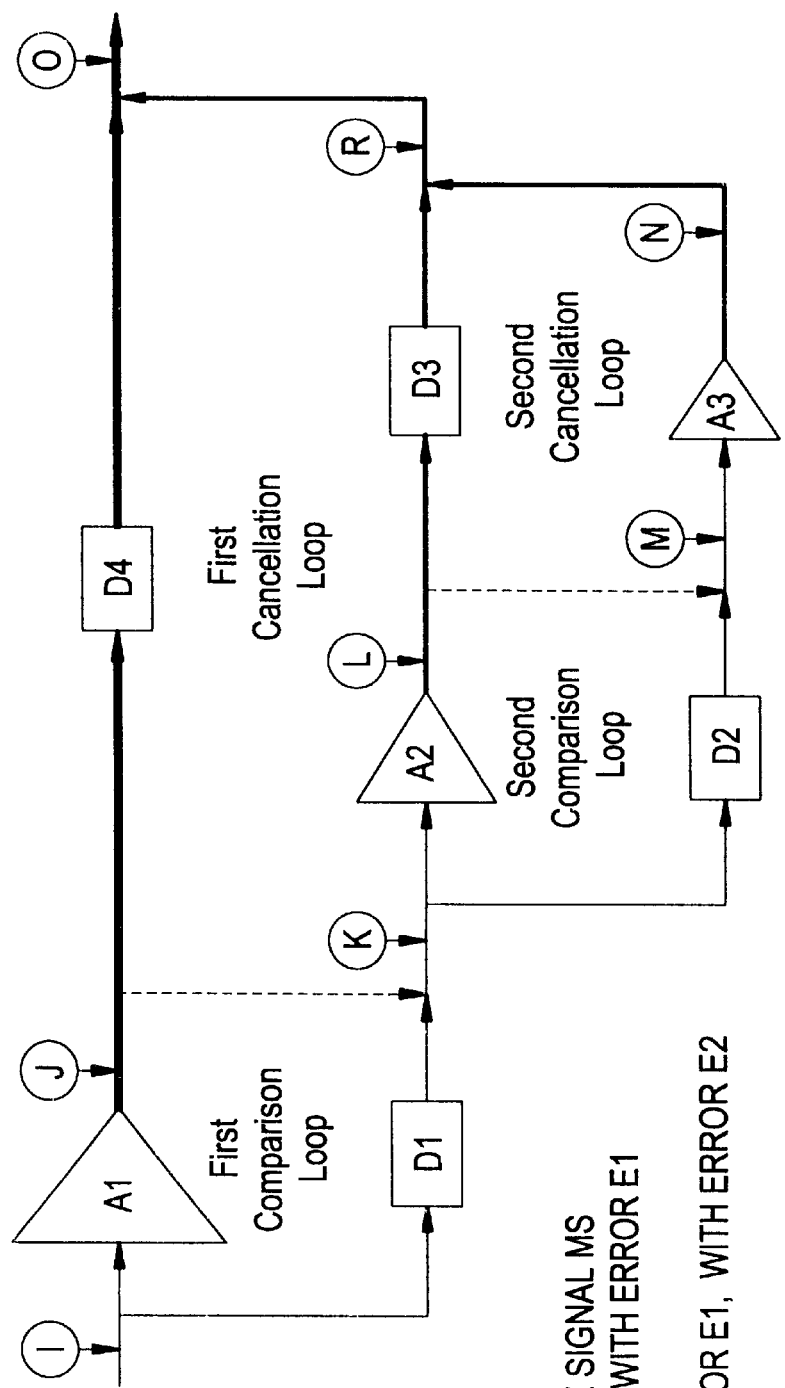
FIG. 1 is a conceptual block diagram of a feed forward amplifier system in accordance with the presently preferred form of the invention, and which identifies signals present at various points in the system; the width of the lines indicating the relative power levels.
Figure 5A:
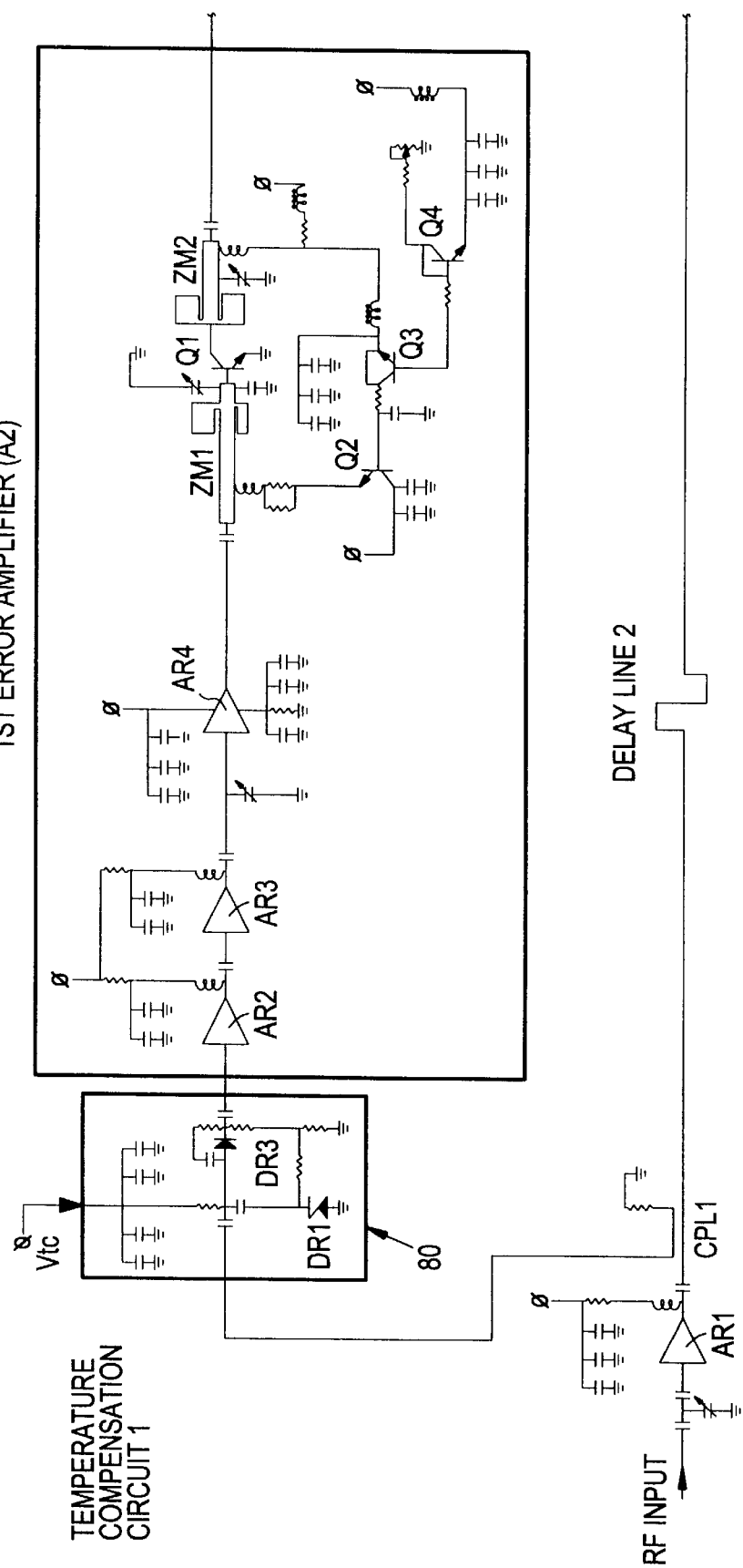
Figure 5B:
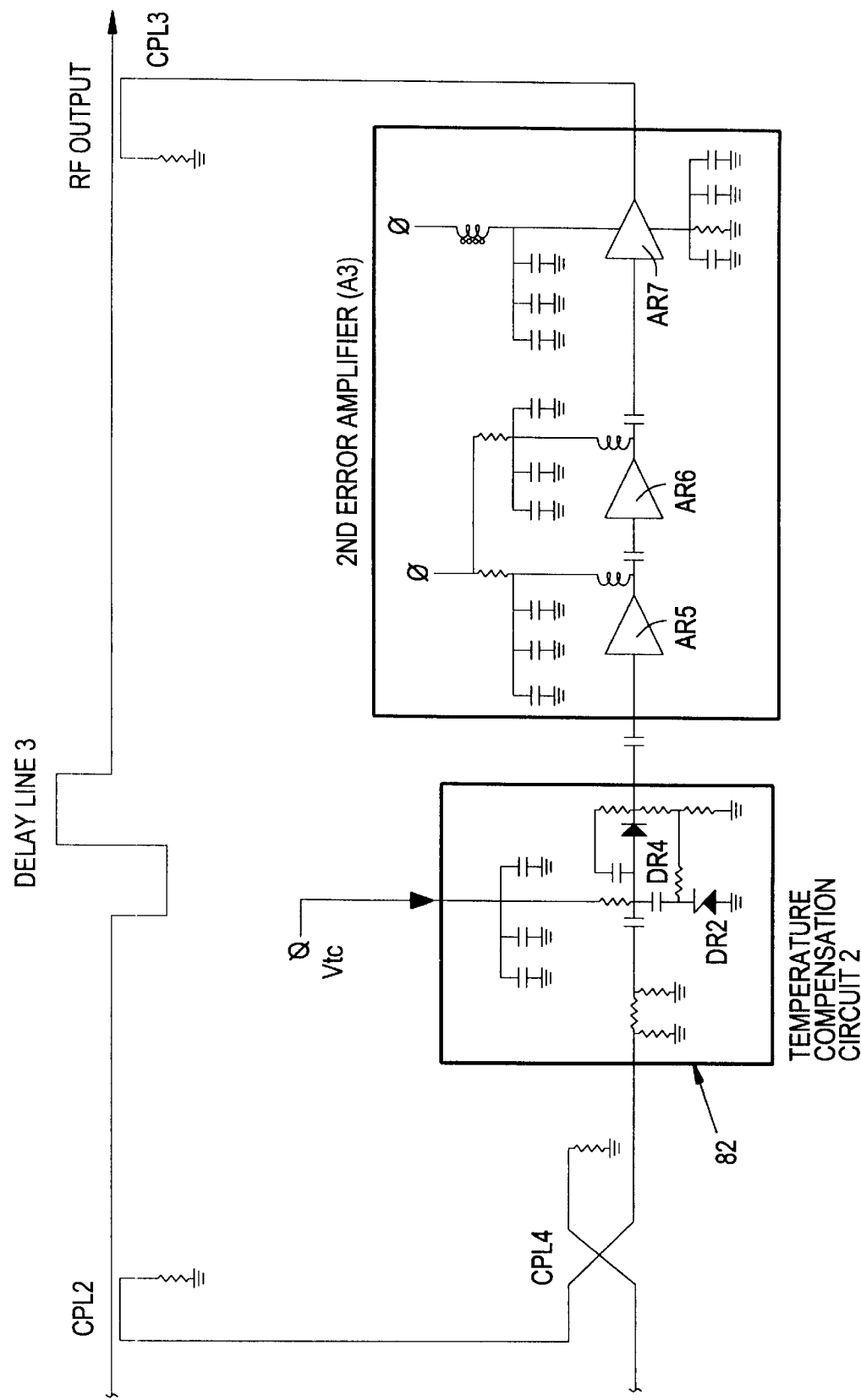
Figure 8:
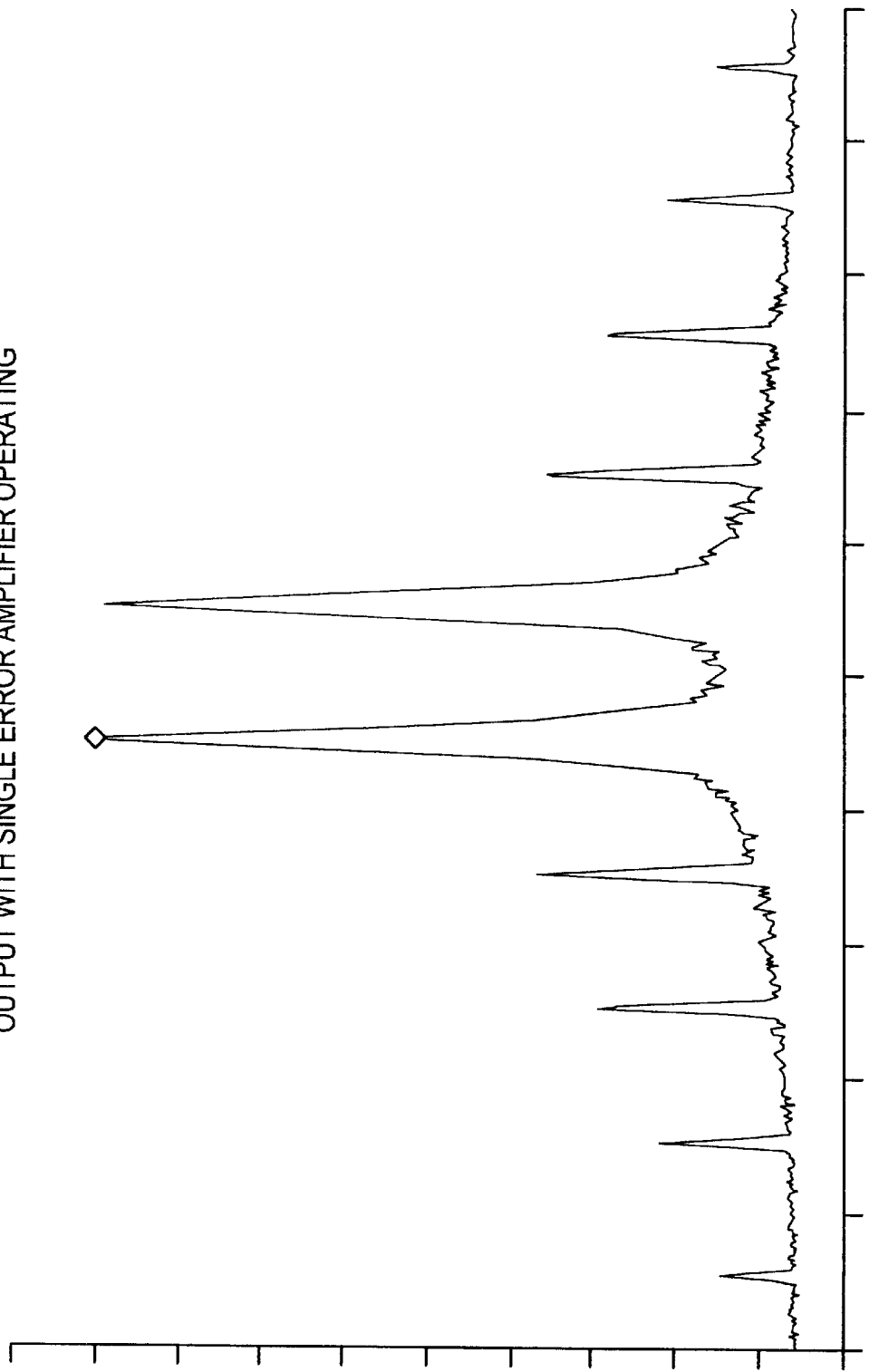

FIGS. 5a, 5b, and 5c are a more detailed schematic block diagram of the presently preferred form of the first and second error amplifiers in accordance with the present invention;

FIG. 6 is a block diagram illustrating power requirements of the feed forward amplifier system of the present invention as compared to a feed forward amplifier system of the prior art;

FIG. 7 is an amplitude vs. frequency plot of actual circuit operation of the presently preferred implementation of the invention showing the message signal as amplified and with error E1 introduced by the feed forward main amplifier (corresponding to point J of FIG. 1);

FIG. 8 is an amplitude vs. frequency plot of actual circuit operation of the presently preferred implementation of the invention showing the amplified message signal (at final output point O of FIG. 1) with the second error amplifier disabled; and FIG. 9 is an amplitude vs. frequency plot of actual circuit operation of the presently preferred implementation of the invention showing the amplified message signal (at final output point O of FIG. 1) with the second error amplifier operable.

Figure 2:
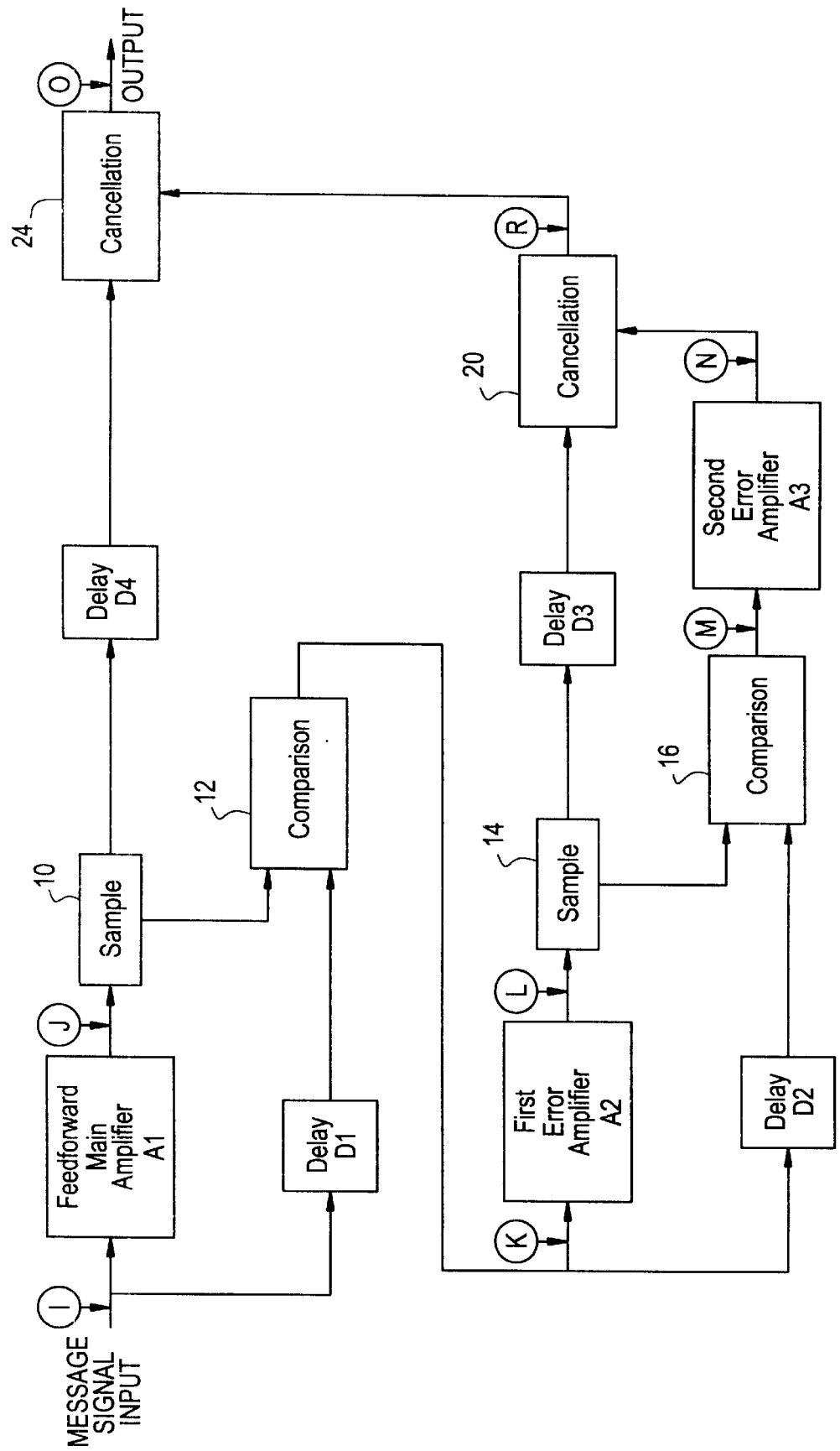
FIG. 2 is a schematic block diagram of operative parts of the system of FIG. 1 necessary to carry out the invention.

CONCEPT OF THE INVENTION
FIGS. 1 and 2

FIG. 1 of the drawings provides a conceptual illustration of the invention. Thus a feed forward amplifier system in accordance with the presently preferred form of the invention has an input I for receiving an input message signal, and a final output point O for delivering the amplified message signal to other utilization circuits or devices. An input message signal MS is supplied to a main amplifier A1 which, while amplifying the input message signal, also inherently introduces a first error E1. This error may, for example, result from circuit non-linearity, inherent noise, spurious signals from outside sources, or other causes of distortion or error.

In FIG. 1 the traditional location of the error amplifier is indicated by the legend A2, but according to the present invention this now becomes a first error amplifier which is deliberately selected with sufficiently low operating power that it cannot faithfully reproduce the original error signal. The operating power level of first error amplifier A2 is selected to be significantly lower than the operating power level of a conventional error amplifier, resulting in significant distortion of the output signal of the first error amplifier. Hence a new error E2, created by the first error amplifier itself, is introduced into the system, but of lesser magnitude.

A lower-power second or auxiliary error amplifier A3 is then utilized to linearly amplify the new error E2 that was created by the first error amplifier A2. An error amplifier sub-system or module thus includes both the primary or first error amplifier A2, and the auxiliary or second error amplifier A3, operating in cascade. This arrangement may be viewed as constituting an error amplifier module that is itself also a feed forward amplifier.

Main amplifier A1 is shown larger than the other two because it has a higher operating power level, while the second error amplifier A3 has the lowest operating power level. According to the invention the combined power requirements of the first and second error amplifiers represent a significant reduction in the total power required for error correction. Heavy lines in FIG. 1 indicate amplified signals, while dotted lines indicate that a signal sample is being taken for purpose of comparison.

As indicated in FIG. 1, a First Comparison Loop is utilized for isolating or identifying the error E1 produced by main amplifier A1. The First Comparison Loop, or main surveillance circuit, compares a sample of the original input signal applied to the input of main amplifier A1 with a sample of the amplified message signal produced at its output, but which also contains error E1. A First Cancellation Loop is then employed to cancel error E1 from the final output signal. However, the First Cancellation Loop does not become fully operational until after the new error E2 created by first error amplifier A2 is also identified and corrected.

Thus a Second Comparison Loop, or secondary surveillance circuit, is employed to provide a signal that is indicative of the newly created or second error E2. The Second Comparison Loop compares a sample of the first error signal E1 applied to the input of first error amplifier A2 with a sample of the amplified but now composite error signal E1, E2, produced at its output. The second comparison loop by comparing those two signals then provides at circuit point M a signal that correctly represents second error E2, separate and apart from the original error E1.

A Second Cancellation Loop, or secondary error correction circuit, is then utilized to cancel second error E2 from the composite error signal, leaving an amplified version of first error E1 to appear at point R in the circuit, as shown in FIG. 1. The amplified first error signal, with the second error signal thus cancelled, is then applied to the amplified message signal in conjunction with the amplified but erroneous message signal to cancel the first error from the amplified message signal and provide an essentially error-free amplified message signal at the final system output O.

Reference is now made to FIG. 2 which will provide a better understanding of the fully operational system. FIG. 2 additionally illustrates time delay, sampling, comparison, and cancellation circuits that are required for an operational system.

Thus the First Comparison Loop also includes a first sampling circuit 10 and a first comparison circuit 12. The output of first comparison circuit 12 then completes the First Comparison Loop and provides a signal independently representing the first error E1 at circuit point K, effectively separating it from the message signal. Circuit point K is also the input of first error amplifier A2, and circuit point L is its output.

Further shown in FIG. 2 are a second sampling circuit 14 and a second comparison circuit 16. The output of second comparison circuit 16 then completes the Second Comparison Loop and provides a signal independently representing the first error E2 at circuit point M, which is also the input of second error amplifier A3.

In the Second Cancellation Loop, or secondary error correction circuit, the signal independently representing error E2 is cancelled from the composite error signal that appears at output L of first error amplifier A2. This is accomplished by a first cancellation circuit 20, which then completes the Second Cancellation Loop and provides at circuit point R an amplified signal representing error E1, and from which error E2 has now been cancelled.

It then becomes possible to complete the work of the First Cancellation Loop by passing the amplified but erroneous and delayed message signal through delay element D4 to a second cancellation circuit 24, together with the amplified error E2, to provide an amplified and fully corrected output message signal at the final output O of the amplifier system.

MORE SPECIFICALLY, a feed forward amplifier system according to the invention has an input I for receiving an input message signal, and a final output point C for delivering an amplified and corrected output message signal to other circuitry. It includes a main amplifier A1 for amplifying the input message signal while inherently also introducing a first error E1 at its output, circuit point J.

The first comparison loop includes a first delay element D1, selected to match the delay through A1, for receiving the input message signal, a first sampling circuit 10 for deriving a sample of the amplified but erroneous message signal, and a first comparison circuit 12 for comparing the delayed input message signal with a sample of the amplified but erroneous message signal. First comparison circuit 12 then produces a signal at circuit point K that independently represents the first error E1.

The First Cancellation Loop is then employed to cancel error E1 from the final output signal. However, the First Cancellation Loop does not become fully operational until after the new error E2 created by first error amplifier A2 is also identified and corrected, and this ultimate function cannot be completed without the second comparison loop and second cancellation loop.

The first cancellation loop includes the first error amplifier A2 which receives and amplifies the first error signal representing first error E1. As previously stated, the primary or first error amplifier A2 is deliberately selected with such characteristics that it cannot fully accomplish the traditional task of amplifying the first error signal E1 without creating new errors or distortion. Hence a new error E2 created by error amplifier A2 itself is introduced into the system at point L. The signal appearing at circuit point L is then a composite, or doubly erroneous, error signal.

The second comparison loop includes a second delay element D2, selected to match the delay through A2, for receiving the first error signal from circuit point K; a second comparison circuit 16 for receiving through first sampling circuit 14 a sample of the output of the first error amplifier A2 that now contains both errors; and for comparing those two signals to then provide a signal that independently represents the second error E2, independent of both the message signal and the first error, at circuit point M.

The second cancellation loop includes a third delay element D3, selected to match the delay through A3, for delaying the output of the first error amplifier A2; a second error amplifier A3 for amplifying the second error signal; and a first cancellation circuit 20 for combining the amplified second error signal received from the second error amplifier A3 at circuit point N with the output of delay element D3 to provide at circuit point R an amplified version of the first error signal from which the second error has now been cancelled.

The first cancellation loop includes a fourth delay element D4, selected to match the entire delay throughout the amplifier sub-system, for delaying the amplified input message signal as it passes toward the final output point O. It also includes a second cancellation circuit 24 for combining the delayed and amplified but error-including input message signal taken from delay element D4 with the amplified and corrected version of the first error signal taken from circuit point R and injecting the resulting signal into the final output O of the amplifier system to provide a corrected and amplified output message signal.

The signal comparison and signal cancellation processes are similar, but not identical. In the comparison process two signal samples are compared or subtractively summed. The purpose or intention of the cancellation process is to counteract, cancel, or destroy a portion of one signal by destructively combining it in appropriate polarity with another signal. The preferred implementations of the comparison circuits and the cancellation circuits will depend upon a number of factors such as signal amplitude at the particular circuit location.

Thus the signal flowing from point R into the second cancellation circuit 24 cancels the amplified error E1 that appears at the output of delay element D4. Final output circuit point O therefore receives the amplified message signal MS, from which error E1 has been cancelled (the new error E2 having been previously cancelled at R). In order to accomplish all of this operation there must be proper matching of time delays, amplitudes, and phase shifts in each of the circuit loops.

IN AN ALTERNATIVE VERSION of the system of FIG. 1, the amplified error signal E2 may be supplied direct to the final output point O, rather than combining with the output of the first error amplifier at point R, as shown.
Preferred System Implementation
FIGS. 3 and 4

Figure 3:
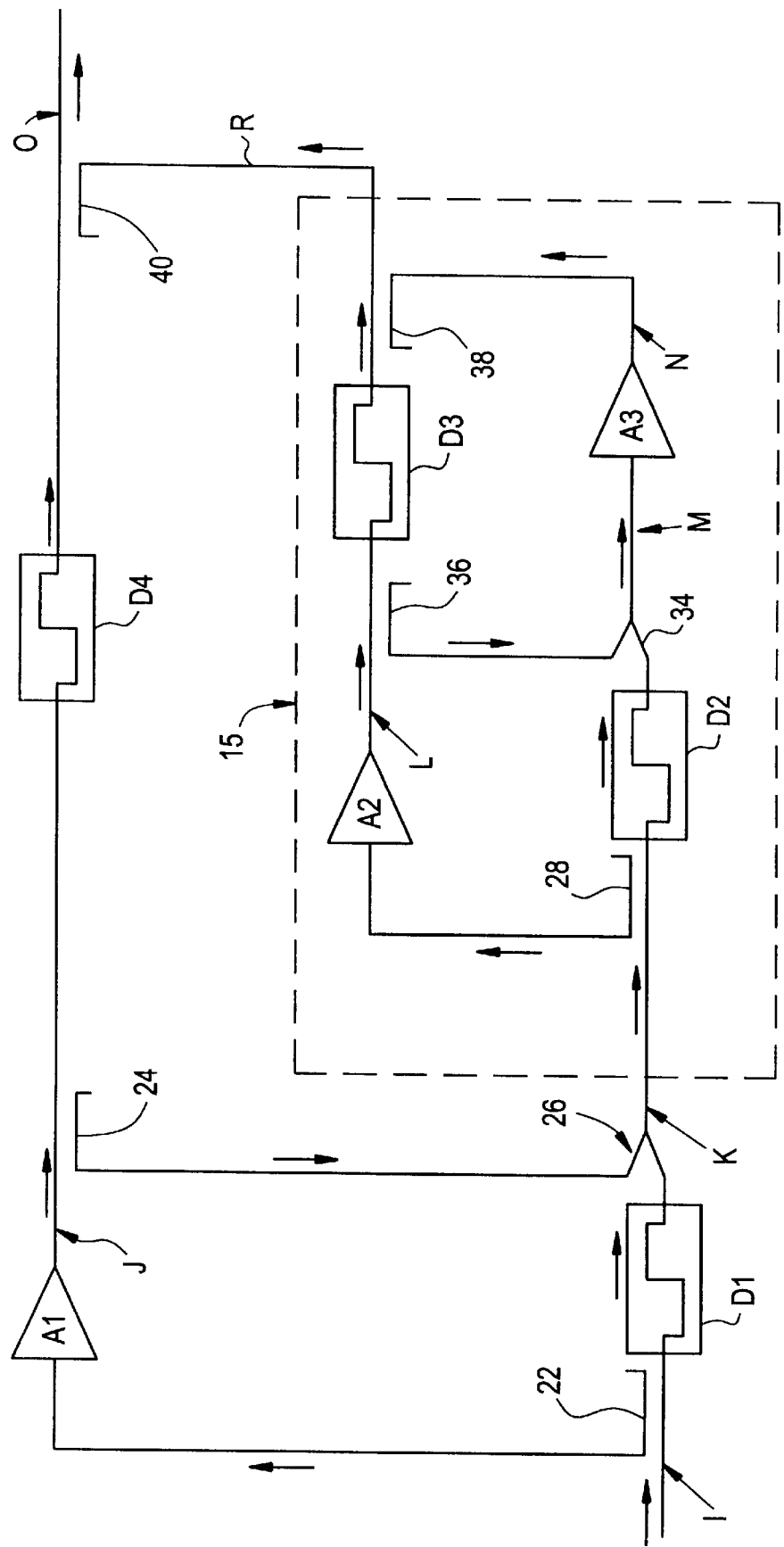
FIG. 3 is a schematic one-line diagram of actual circuitry of the main amplifier and error amplifier sub-system of the present invention in accordance with FIGS. 1 and 2.
Figure 4:
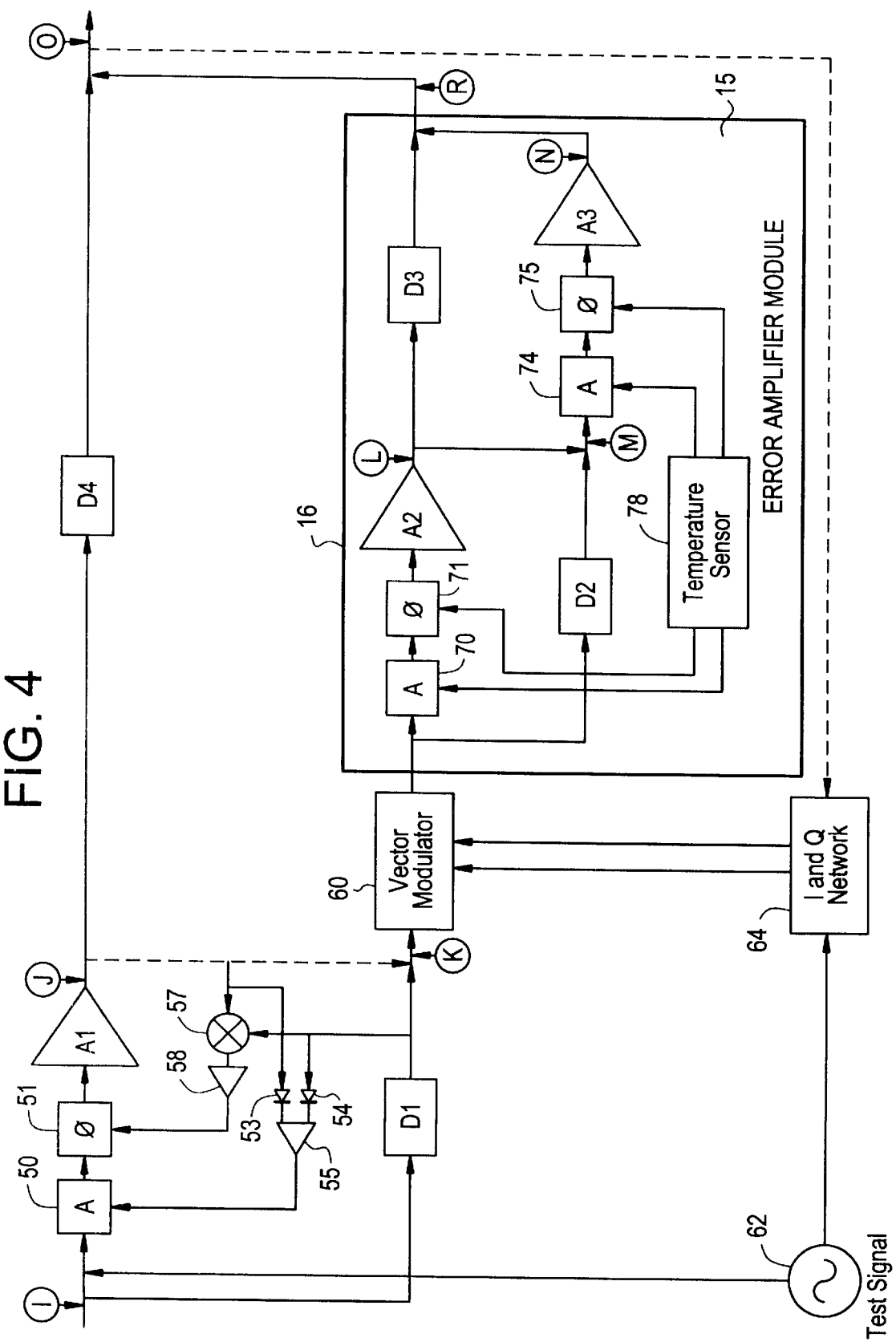
FIG. 4 is a schematic block diagram of the presently preferred form of feed forward amplifier system in accordance with the invention, showing amplitude and phase correction for both of the comparison loops and both of the cancellation loops.

FIGS. 3 and 4 show the same system as FIGS. 1 and 2, but with standard electrical symbols that indicate the presently preferred implementation of the circuit. The error amplifier module is indicated at 15 within dotted lines in FIG. 3, and solid lines in FIG. 4.

Referring now specifically to FIG. 3, after input I a coupler 22 directs the signal to both the main amplifier A1 and delay element D1. From the output of A1 a coupler 24 picks up a sample of the message signal, which has been amplified with error introduced. This sample and the output of device D1 are then supplied at near equal amplitudes and substantially antiphase to a summing device 26, producing at circuit point K a signal representing error E1.

The signal from point K goes to a coupler 28 which directs the signal to both the first error amplifier A2 and the delay element D2. The output of first error amplifier A2, where the composite error signal, E1+E2, first appears, is designated as L. A coupler 36 picks up a sample of the composite or doubly erroneous error signal from point L, which with the output of device D2 is supplied to a summing device 34, antiphase and with equal amplitudes, producing at circuit point M a signal independently representing error E2, separate and distinct from error E1.

The output signal from A2 is also supplied to delay device D3, from whence the output of second error amplifier A3 at circuit point N is combined with it through a coupler or combiner 38, cancelling E1. The resulting signal at circuit point R is then combined with the output of delay element D4 through a combiner 40 cancelling E1 to provide at system output O the final output signal, which is an amplified message signal with errors corrected.

In order to constructively cancel the unwanted signal components, feed-forward amplifiers require not only the matching of time delays between parallel signal paths, as described above in connection with FIGS. 1 and 2, but also a precise phase and amplitude match between the parallel paths. In a classical feedforward amplifier two sets of such paths must be matched for time delay, phase, and amplitude; namely, there must be matching of the two paths within the comparison loop, and matching of the two paths within the cancellation loop.

The present invention, however, essentially comprises two feedforward amplifiers each having a comparison loop and a cancellation loop. The complete amplifier system of the present invention therefore has effectively four sets of parallel paths which must be matched as to time delay, phase, and amplitude: namely, in the comparison loop and the cancellation loop of the main amplifier; and in the corresponding two paths within the error amplifier module itself.

Referring specifically still to FIG. 3, the first two paths which must be matched are in the first comparison loop, including the primary amplifier path comprising the coupler 22, main amplifier A1, and coupler 24; and the main delay line path comprising delay line D1. These two paths must be matched such that the message signal as fed through the delay line will sufficiently cancel the message signal coupled from the primary amplifier output as to leave only message error signal representing first error E1 at circuit point K to be amplified by the first error amplifier A2. Furthermore, circuit performance may drift as a result of time or of temperature changes. Thus, the matching or balancing of time delays, phase, and amplitude must still be effective when such changes occur.

Reference is now made specifically to FIG. 4, which is a schematic block diagram illustrating the presently preferred practical implementation of phase and amplitude compensation circuitry in accordance with the present invention.

To compensate the first comparison loop, the preferred implementation uses a standard comparison method, believed to be entirely conventional. To compensate for amplitude drift, the sampled output of amplifier A1 and the delayed message signal are detected by detectors 53 and 54 and their amplitudes compared by comparison amplifier 55, the output of which is used to control a PIN diode attenuator 50. To compensate for delay and hence, phase drift, the sampled output of A1 and the delayed message signal are mixed with mixer 57, providing a signal whose amplitude is a function of the phase difference between the two signals. The buffered signal from an amplifier 58 is used to control a varactor diode phase shifter, 51.

The second two paths (see FIG. 3) which must be matched are the first cancellation loop paths, including the error amplifier path comprising summing device 26, coupler 28, first error amplifier A2, and delay element D3; and the primary amplifier output delay path comprising delay line D4. These two paths must be matched such that the error products E1 introduced by the main amplifier are canceled by the signal produced at circuit point R by the error amplifier module 15. As previously noted, the functions of both the second comparison loop and the second cancellation loop must be completed before the work of the first cancellation loop can be accomplished.

To counteract drift in the gain and phase characteristics of circuit elements, practical feed-forward amplifiers commonly employ active compensation to preserve optimal circuit function. Drift may result from temperature changes, normal component changes over time, changes due to the signal level upon which the amplifier is operating, or, in the case of the main amplifier output, from changes in the load which the amplifier is driving. A number of techniques for compensating for such drift are well known in the art, including negative feedback circuits for compensating and stabilizing the main amplifier path; methods using a test signal injected into the main amplifier input path and sensed at the amplifier output to derive control signals to control the amplitude and phase of the error amplifier operation [see U.S. Pat. Nos. 5,323,119 and 5,508,657); and methods involving the characterizing of circuit performance over temperature, storing compensation values in a look-up table, and employing a microcontroller system to control gain and phase compensation components in the various signal paths.

Further, it may be advantageous to deliberately detune the cancellation of a pilot or test signal at a known frequency, so that the overall circuit performance will be somewhat less desirable for that particular frequency but will be improved across the desired frequency band as a whole, as described in the copending application of Behan et al, Ser. No. 08/545,987 filed Oct. 20, 1995, now U.S. Pat. No. 5,768,699.

Any of the commonly known techniques may be utilized to compensate the first comparison loop, such as those that are described in U.S. Pat. No. 5,508,657, and in our copending application Ser. No. 08/545,987 filed Oct. 20, 1995.

In the error amplifier module of the present invention, the preferred implementation utilizes simple temperature compensation techniques to adjust for component drift. Since the preferred embodiment utilizes class A amplifiers as the first and second error amplifiers A2 and A3, and such amplifiers are known to have the general characteristics of linear phase and amplitude drift with temperature, more complex compensation techniques are unnecessary. Also, since the error amplifier module is embedded within the overall amplifier system, the load on the first error amplifier can be controlled and the need to compensate for differing load characteristics is avoided. The error amplifier module is also sufficiently compact that it may be manufactured as a single module mounted on a common heat sink, thus effectively resulting in the temperatures of the various components tracking in temperature.

As also shown in FIG. 4, a single temperature sensor 78 provides control signals for PIN diode attenuators 70 and 74 and varactor diodes 71 and 75 to compensate for amplitude and phase drift, respectively, in both the second comparison loop and the second cancellation loop.

To compensate operation of the first cancellation loop, the preferred implementation uses a technique employing a test tone as described in the issued Behan U.S. Pat. No. 5,508,657. The message signal error is broken into quadrature components whose amplitudes are dynamically and independently controlled by a negative feedback circuit before they are combined into a single vector error signal which is then amplified before its application to a near-final output circuit. A test signal 62 is injected into the input path of main amplifier A1 prior to pin diode attenuator 50 and varactor diode phase shifter 51, but does not flow to delay device D1. The test signal and a sample of the amplifier output signal O both are sent to I and Q Network 64, which produces quadrature signals that control vector modulator 60, correcting for system gain and phase shift. This then completes the compensation of the first cancellation loop.

A housing indicated by heavy line 16 in FIG. 4 schematically indicates a metallic enclosure that encompasses all of the components of the amplifier module 15 and provides a common heat sink for all of them.

Preferred Embodiment of the Error Amplifier Module

FIGS. 5a, 5b, 5c

FIG. 5 is a schematic diagram of the Error Amplifier Module of the presently preferred implementation of the invention, with FIG. 5a showing the RF input of the Error Amplifier Module, First Error Amplifier, Delay Line DL2, and Temperature Compensation Circuit 80; FIG. 5b showing the Second Error Amplifier, Delay Line DL3, and Temperature Compensation Circuit 82; and FIG. 5c showing the Temperature Compensation Control Circuit 84 and Major Parts List for the Error Amplifier Module.

As shown in FIG. 5a, the RF Input signal at the input of the Error Amplifier Module is buffered by a small signal RF amplifier MMIC ("Microwave Monolithic Integrated Circuit"), AR1, before the signal is divided by a 10 dB coupler CPL1. The main signal from CPL1 goes to Delay Line DL2, while a sample of the signal 10 dB down in amplitude goes to Temperature Compensation Circuit 80, and then on to the First Error Amplifier.

A First Temperature Compensation Circuit 80 comprises a varactor diode DR1 and PIN diode DR3, plus biasing components for the diodes. Varactor diode DR1 controls the phase of the message signal as a function of a control signal Vtc, while PIN diode DR3 controls the amplitude of the message signal as a function of Vtc. The characteristics of the diodes and the values of the biasing components are selected together with the components of Temperature Compensation Control Circuit 80 (described below) to effectively compensate the temperature-related phase and gain characteristics of the First Error Amplifier.

The First Error Amplifier comprises two stages of amplification through small signal RF MMIC's AR2 and AR3, followed by a third amplification stage AR4, a 1-Watt Class-A RF Power Module. RF power transistor Q1 provides a final, high-power (9-Watt) output. Impedance matching circuits ZM1 and ZM2 match the input and output impedance of the final amplifier stage to the 50-ohm line impedance. Bias transistors Q2, Q3, and Q4 and related circuitry provide the correct operating bias for power transistor Q1. Delay Line DL2 preferably comprises a loop of coaxial cable, with the length selected to provide an RF signal delay substantially matching the delay through the First Error Amplifier A2 and Temperature Compensation Circuit 80.

As shown in FIG. 5b, the output signal from the First Error Amplifier passes through coupler CPL2, Delay Line DL3, and coupler CPL3 to the output of the Error Amplifier Module 15 of FIG. 3. A 30 dB coupler CPL2 provides a sample of the output signal of the First Error Amplifier to coupler CPL4, which is a 3 dB hybrid. The signal gain and delay characteristics of the components making up the Second Comparison Loop (see FIG. 1) are selected such that the message signal from Delay Line DL2 effectively cancels the message signal from coupler CPL2, leaving only the amplifier error signal, as is well understood in the art.

The output of coupler CPL4, essentially the sampled error from the First Error Amplifier, is routed through second Temperature Compensation Circuit 82 to the Second Error Amplifier. The operation of Temperature Compensation Circuit 82 is essentially the same as Temperature Compensation Circuit 80, described above. The Second Error Amplifier A3 comprises two stages of amplification through small signal RF MMIC's AR5 and AR6, followed by a third and final amplification stage AR7, a 1-Watt Class-A RF Power Module.

Delay Line DL3 preferably comprises a loop of coaxial cable, with the length selected to provide an RF signal delay matching that which occurs through the Second Error Amplifier and the Second Temperature Compensation Circuit 82.

The output of the Second Error Amplifier is recombined with the RF output signal from A2 by 10 dB coupler CPL3. The signal gain and delay characteristics of the components making up the Second Cancellation Loop (see FIG. 1) are selected such that the error in the RF output contributed by the First Error Amplifier is effectively canceled by the amplified message error signal from the Second Error Amplifier, again as is known in the art.

It may be noted that while in the block diagrams of FIGS. 1, 2, 3, and 4 the amplifiers A1, A2, and A3 are indicated as discrete functional blocks, in practice some of the gain stages needed to achieve the desired overall system gains may be common to several of the paths. Thus, in the preferred implementation, AR1 is common to both the first and second error amplifier paths.

FIG. 5c shows the Temperature Compensation Control circuitry. As described above, the preferred embodiment of the Error Amplifier Module 15 utilizes a single, common heatsink for all of the circuitry; thus, only a single temperature sensor TS1 is needed for both temperature compensation circuits. The output of Temperature Sensor TS1 is buffered and formated by operational amplifiers U1 and U2; potentiometer K1 allows the output range of TS1 to be properly centered.

Power Efficiency
FIG. 6

FIG. 6 illustrates typical operating power requirements of the present invention relative to those of a prior art feed-forward amplifier of comparable output power an linearity, and demonstrates the power saving that is achieved by the presently preferred embodiment of the invention, while maintaining the linearity of output message signal. It may be observed that in the prior art amplifier, the error amplifier, because it must linearly reproduce the entire error signal, consumes nearly as much power as the primary amplifier itself. In the present invention, the combined first and second error amplifiers require approximately one-third the power of a comparable prior art error amplifier. The second error amplifier, with equivalent linearity as the prior art error amplifier, requires approximately one-tenth the operating power.

Waveforms of the Operating Circuit

FIGS. 7, 8, and 9 are spectrum analyzer plots which demonstrate the operation of the preferred implementation, as viewed at the amplifier output (signal point "O" in FIG. 1). The plots show relative signal amplitude, in decibels (dB), versus frequency. For test purposes an amplifier input consisting of only two test tones was used.

FIG. 7 shows the output of the feed forward main amplifier before error correction, with the amplified tones being the two large "peaks" near the center of the plot. If the main amplifier were an ideal amplifier, the output signal would consist only of the two tones. The lower-level signals on either side of the test tones represent intermodulation distortion introduced by the main amplifier.

FIG. 8 shows the amplifier output after error correction, but with the second error amplifier A3 disabled. The only error correction achieved is thus due to entirely to the first error amplifier. The intermodulation distortion is seen to be significantly reduced, but substantial distortion is still present. In actuality, it is understood that the first error amplifier cancels most of the errors that had been introduced by the main amplifier (including intermodulation distortion, other forms of distortion, and noise), and that the error signals shown in FIG. 8 are primarily due to new distortion introduced by the first error amplifier itself.

It may be observed that the error signals in FIG. 8 are roughly 10 dB lower in magnitude than those in FIG. 7. A 10 dB reduction in the signal voltage level means that the second error amplifier must linearly amplify a signal only 1/(square root of 10) as large, in terms of voltage levels, as the error introduced by the main amplifier. A square root of 10 reduction in signal voltage level permits an order-of-magnitude reduction in operating power consumption of the amplifier while preserving the same linearity. The reduction in signal level from the first error signal to the second error signal accounts for the reduction in operating power from the prior art error amplifier and the second error amplifier of the present invention, as shown in FIG. 6.

FIG. 9 shows the amplifier output with the second error amplifier enabled. Substantially all of the spurious signals introduced by the first error amplifier have now been canceled by the amplified second error signal.

In general, the paramaters of the amplifier system could be selected somewhat differently, and the difference in power levels between the first and second error amplifiers would change accordingly; but according to the present invention the power level of the second error amplifier will always be less than that of the first error amplifier.

The presently preferred embodiment of the invention has been described in considerable detail in order to comply with the patent laws. However, the scope of the invention is to be determined only in accordance with the appended claims.

What we claim is:

1. A feed forward amplifier system having a final output point, and comprising:

means for receiving an input message signal;

a main amplifier for amplifying the input message signal while inherently introducing a first error;

a first comparison loop including a first delay element for receiving the input message signal, and a first comparison circuit for comparing a sample of the thus-delayed input message signal with a sample of the amplified but erroneous message signal to produce a signal that independently represents the first error;

a first cancellation loop having a first error amplifier operated at a reduced power level which receives the first error signal and while amplifying the first error signal also introduces a second error;

a second comparison loop including a second delay element for receiving the first error signal, a second comparison circuit for receiving a sample of the output of the first error amplifier that now contains both errors, and for comparing those two signals to then provide a signal that independently represents the second error;

a second cancellation loop including a third delay element for delaying the output of the first error amplifier, a second error amplifier for amplifying the second error signal, and a first cancellation circuit for combining the amplified second error signal from the second error amplifier and the output of delay element to provide a modified and amplified version of the first error signal from which the second error has now been cancelled;

the first cancellation loop having a single delay means for delaying the amplified input message signal as it passes toward the final output point, and also including a second cancellation circuit for injecting the thus-modified and amplified version of the first error signal together with the delayed and amplified input message signal into the final output of the amplifier system to provide a corrected output message signal; and wherein both the first error amplifier and the second error amplifier are in thermal communication with a common heat sink, and which further includes a single temperature sensor having associated control means for compensating both the amplitude drift and the phase drift of both the first error amplifier and the second error amplifier.

2. A feed forward amplifier as claimed in claim 1 which further includes a negative feedback circuit responsive to a test signal for compensating and minimizing variation or drift in the operation of the error amplifier module.

\* \* \* \* \*